United States Patent
Alper et al.

(10) Patent No.: US 9,556,020 B2
(45) Date of Patent: Jan. 31, 2017

(54) METHOD OF WAFER-LEVEL HERMETIC PACKAGING WITH VERTICAL FEEDTHROUGHS

(71) Applicants: Said Emre Alper, Ankara (TR); Mustafa Mert Torunbalci, Ankara (TR); Tayfun Akin, Ankara (TR)

(72) Inventors: Said Emre Alper, Ankara (TR); Mustafa Mert Torunbalci, Ankara (TR); Tayfun Akin, Ankara (TR)

(73) Assignee: Said Emre Alper, Ankara (TR)

( * ) Notice: Subject to any disclaimer, the term of this patent is extended or adjusted under 35 U.S.C. 154(b) by 0 days.

(21) Appl. No.: 14/915,633

(22) PCT Filed: Sep. 11, 2013

(86) PCT No.: PCT/TR2013/000298
§ 371 (c)(1),
(2) Date: Feb. 29, 2016

(87) PCT Pub. No.: WO2015/038078
PCT Pub. Date: Mar. 19, 2015

(65) Prior Publication Data
US 2016/0221824 A1 Aug. 4, 2016

(51) Int. Cl.
| H01L 23/10 | (2006.01) |
| B81C 1/00 | (2006.01) |
| H01L 23/04 | (2006.01) |
| H01L 23/02 | (2006.01) |
| H01L 23/06 | (2006.01) |

(52) U.S. Cl.
CPC .......... *B81C 1/00301* (2013.01); *H01L 23/02* (2013.01); *H01L 23/04* (2013.01); *H01L 23/06* (2013.01); *H01L 23/10* (2013.01); *B81B 2207/095* (2013.01); *B81C 2203/0118* (2013.01); *B81C 2203/0145* (2013.01); *B81C 2203/031* (2013.01);
(Continued)

(58) Field of Classification Search
CPC .......... H01L 23/10; H01L 23/04; H01L 23/02; H01L 23/06
See application file for complete search history.

(56) References Cited

U.S. PATENT DOCUMENTS
| 2009/0145227 A1 | 6/2009 | Wenk |
| 2010/0176466 A1 | 7/2010 | Fujii |
| 2011/0227174 A1 | 9/2011 | Fujii |

FOREIGN PATENT DOCUMENTS
WO  WO 2013024658 A1  2/2013

*Primary Examiner* — Amar Movva
(74) *Attorney, Agent, or Firm* — Gokalp Bayramoglu

(57) ABSTRACT

A wafer-level packaging method for MEMS structures that are desired to be encapsulated in a hermetic cavity and that need the transfer of at least a single or multiple electrical leads to the outside of the cavity without destroying the hermeticity of the cavity. Lead transfer is achieved using vertical feedthroughs that are patterned on the capping substrate within the same fabrication step to produce the encapsulating cavity. Furthermore, the structure of the vertical feedthroughs and via openings to reach these feedthroughs are arranged in such a way that conventional wirebonding would be sufficient to connect the vertical feedthroughs to the outer world, without a need for conductor-refill inside the via openings. The method is compatible with low-temperature thermocompression-based bonding/sealing processes using various sealing materials such as thin-film metals and alloys, and also with the silicon-glass anodic or silicon-silicon fusion bonding processes.

14 Claims, 5 Drawing Sheets

(52) U.S. Cl.
    CPC .... *B81C 2203/035* (2013.01); *B81C 2203/036* (2013.01); *B81C 2203/0792* (2013.01)

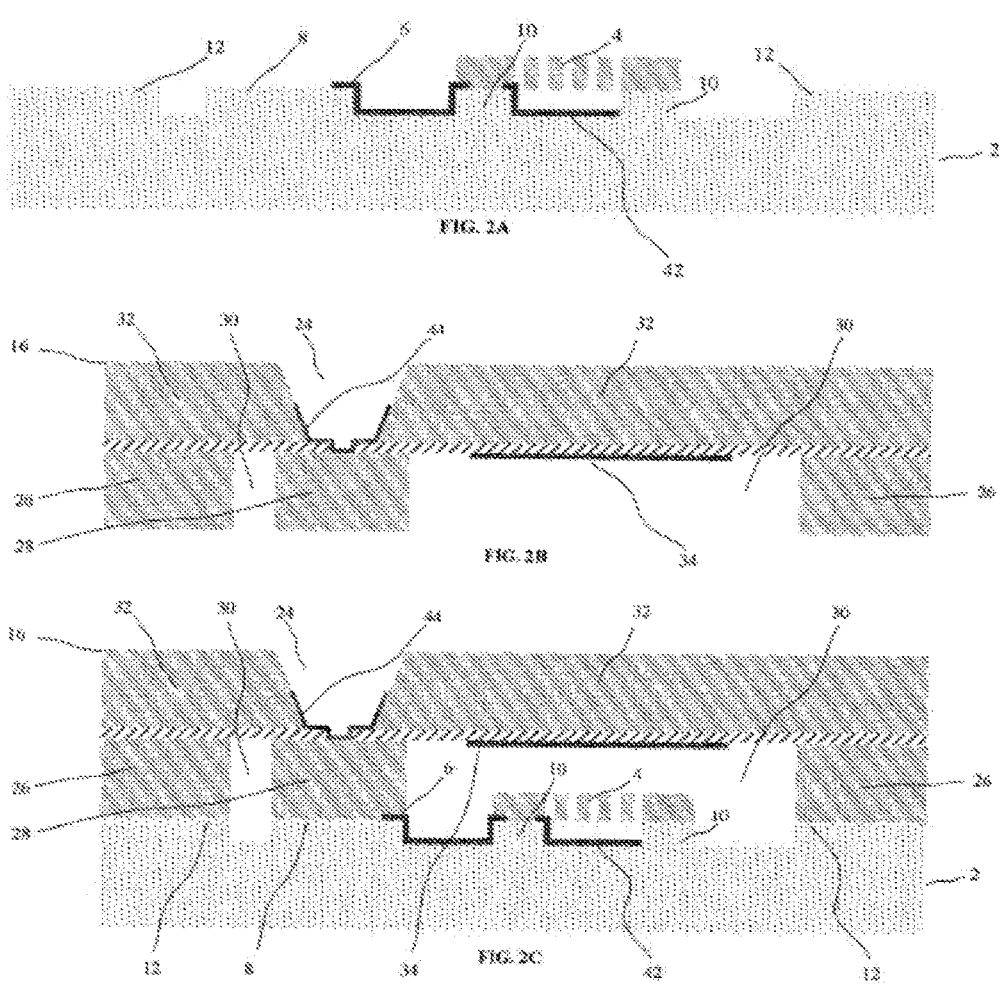

METHOD OF WAFER-LEVEL HERMETIC PACKAGING WITH VERTICAL FEEDTHROUGHS

RELATED FIELD OF THE INVENTION

This invention relates to the field of wafer-level packaging of microstructures that need to be encapsulated in a hermetic cavity and having a single or multiple electrical leads to be transferred to the outside of the cavity without destroying the hermeticity of the cavity.

BACKGROUND OF THE INVENTION (PRIOR ART)

Micro-electro-mechanical systems (MEMS) enables the development of state-of-the-art transducers, sensors, actuators, resonators, etc. used in a variety of applications ranging from consumer electronic market towards the automotive and even military electronic products. MEMS products offer the advantages of lower cost, better compatibility with high-volume batch fabrication, smaller space requirement, and higher reliability compared to the conventional electromechanical systems. The core of the MEMS products include precision micromachined electro-mechanical components that transduce physical, chemical, biological, etc. signals to electrical signals. Some of these micromachined components must have a direct physical contact with the outer world, as in the case of the gas flow sensors or pressure sensors. On the other hand, a great variety of the micromachined components, including but not limited to the inertial sensors, resonators, and infrared detectors, must be isolated from the atmosphere of the ambient in which they are operated. This isolation is necessary for both "forming a controlled operating atmosphere for the micromachined component" and "keeping these tiny components safe from the adverse effects of various factors including solid, liquid and/or gas contamination, humidity, and/or pressure variations". Isolation of the micromachined components from the ambient is simply achieved by encapsulating them in hermetically-sealed packages.

The earlier examples of packaging MEMS components achieve hermetic sealing of every fabricated MEMS component individually, which increases the packaging cost due to the increased labor and time as well as reduced the process yield and reliability. An obviously better alternative is to seal the MEMS component at the wafer-level, which reduces the packaging costs significantly by minimizing the labor and time as well as increasing the process yield and reliability. Wafer-level packaging typically refers to the use of wafer-level MEMS processing techniques to form a capping element (either a layer or a wafer) on top of a sensor wafer that contains the MEMS components to be packaged. This way, all the MEMS components located on a sensor wafer can be encapsulated simultaneously. Encapsulation, however, is just the first half of the packaging process, whereas the second half is nothing but the transfer of the electrically conductive leads of the encapsulated MEMS component to the outer world without degrading the hermeticity of the encapsulation.

There are various methods reported in the prior art for the wafer-level encapsulation of MEMS components including techniques for lead transfer. Well known in the prior art is the use of glass-frit as the sealing material between a cap wafer and a sensor wafer, for which the leads of the encapsulated MEMS component is transferred laterally through the surface of the sensor wafer and creating a step-height below the glass-frit material, which must be sealed properly. Sealing step-heights up to few micrometers with glass-frit material is not a significant problem, since the glass-frit has a thickness typically more than 25 µm after firing. On the other hand, temperatures required for glass-frit bonding exceed 430° C., which may not only limit the number of compatible materials that can be used on the MEMS component but may also result in a high packaging stress. Moreover, glass-frit is a thick-film paste that has the risk of creating free-to-move frit particles inside the encapsulated cavity and contaminating the MEMS components, which may both reduce the packaging yield and long-term reliability. Finally, the hermeticity of the glass-frit is known to be worse compared to metal-based alloys used as sealing materials.

Another method in the prior art is the use of metal-based alloys as the sealing material (Au—In, Au—Sn, Al—Ge, Si—Au, etc.). These alloys generally provide better hermeticity compared to the glass-frit as well as require lower process temperatures typically in the range from 200° C. to 400° C. for various alloy materials and compositions. However, being electrically conductive, these sealing materials do not allow lead transfer through the sealing region, unless an additional insulating layer is used between the leads and the sealing material. Even with this insulating layer, the metal-based sealing material must still be capable of covering the step-height caused by the leads passing under the sealing region, which typically requires a sealing material thickness of a few microns or more. Such a thickness is not desired for metal-alloy based sealing materials due to the increased mechanical stress and also the cost of the thicker metal layers.

In the other examples of the prior art, the leads are transferred to the outer world using conductive feedthrough patterns that are machined vertically with respect to the surface of the sensor wafer. This way, a thinner sealing material can be used for sealing the MEMS component since the leads in this case do not cause a step-height under the sealing region as they are transferred to the outer world through a path that does not cross through the sealing region. Still, implementing the vertical feedthroughs increases the complexity and number of steps of the processes used to fabricate either the sensor or the cap wafers, or both. One of the difficulties with the vertical feedthrough processes is to achieve the sealing and the lead transfer in the same step, which requires precise control of the thickness' of the sealing material, sensor leads, sealing regions, vertical feedthroughs. Any offsets between some of these parameters may form "a properly encapsulated cavity without a successful lead transfer", or "a successful lead transfer without an encapsulated cavity". Another difficulty with some of the prior art using vertical feedthroughs is the void-free and hermetic filling of the via openings with a conductive material, which will form the vertical feedthroughs.

In summary, it is desirable to develop a method that achieves hermetic sealing of MEMS components by using either metal-alloy based sealing materials or even by some well-known bonding methods that do not require a sealing material at all. Moreover, this method should allow lead transfer using vertical feedthrough patterns that are formed by well-known MEMS etching processes, without requiring complex via-fill, trench-refill, or similar deposition-based techniques. A method with the abovementioned features would eliminate both the need for "high-temperature sealing processes" and also "refilling the vertical feedthrough patterns", improve the process yield, reliability, and compatibility with different sensor processes, while reducing the packaging costs significantly.

BRIEF DESCRIPTION OF THE INVENTION

The present invention provides a method of wafer-level hermetic sealing process with vertical feedthroughs for lead transfer, which is compatible with low-temperature bonding/sealing processes as well as requiring no re-fill inside the vertical feedthrough via openings, providing a very easy way of both hermetic sealing and lead transfer. A few embodiments of the present invention are disclosed, some of which providing the advantages of "eliminating the need for a sealing material" or "minimizing the number of process steps required for the fabrication of a sealed MEMS structure". Although four exemplary embodiments are disclosed for the present invention, more can be disclosed within the scope and spirit of the present invention.

The method described in this invention requires the bonding of two substrates, one of which contains the MEMS component to be sealed, and called the sensor substrate. The second substrate is called the capping substrate, and is used for hermetically sealing and also for the lead-transfer of the MEMS components laid on the sensor substrate. The fabrication of the sensor substrate can be achieved by using a variety of methods described in the prior-art, targeting to produce a silicon microstructure that is typically suspended over the substrate surface with an offset of few microns. Either the sensor substrate or the capping substrate or both substrates may also contain integrated circuits fabricated through a CMOS or a similar fabrication process.

In different embodiments of the present invention, the fabrication of the sensor substrate can be achieved by using any standard MEMS or CMOS+MEMS processes well-known by the ones skilled in the art. These processes may include different surface and bulk micromachining methods, and may utilize different sensor substrates including but not limited to silicon, SOI, glass, or CMOS. The packaging method disclosed by the present invention is compatible with many different sensor substrate structures, as described in the exemplary embodiments of the present invention.

The fabrication of the cap wafer of the present invention requires double-face patterning of an SOI wafer or a wafer having a similar structure, only by using straightforward silicon etching and thin-film deposition/etching techniques. Etching the first face of the cap wafer simultaneously forms "the cavity in which the MEMS component will be encapsulated" as well as "the vertical feedthrough patterns that would face the conductive leads of the MEMS component to be encapsulated inside the cavity". Etching the second face of the cap wafer forms the "via openings" that reach to "the surfaces of the vertical feedthrough patterns that would face the outer world". In different embodiments of the present invention, it is also possible to deposit and pattern metal layers on a single or both faces of the cap wafer, acting either as a sealing material, a getter material, or a wirebonding pad, depending on the deposition site.

The advantages of the method described in the present invention are listed below:

a. The present invention utilizes simultaneous patterning of both the "encapsulating cavity" and "vertical feedthroughs" on the capping substrate, simplifying the fabrication process of the capping substrate.

b. The present invention eliminates the need for refilling the via openings that reach to the vertical feedthrough patterns fabricated on the capping substrate. Opening these vias neither causes any harm to the sealing region nor affects the hermeticity of the encapsulated cavity.

c. The present invention is compatible with low-temperature thermo-compression-based bonding/sealing processes using various sealing materials such as thin-film metals and alloys, and also in some of the embodiments, with the silicon-glass anodic or silicon-silicon fusion bonding processes, which do not require any sealing material to be deposited on neither the sensor nor the capping substrates for bonding/sealing.

d. In some of the embodiments of the present invention, it is possible to use the metal layer of the sensor substrate, which is intentionally laid over the sealing region of the sensor substrate, as the sealing material. This eliminates the need for an additional sealing material patterned on the capping substrate, although a different sealing material can still be used if desired, provided that the sealing material is electrically conductive.

e. The present invention is compatible with almost any sensor substrates on which the sealing region and the conductive leads of the MEMS component are laid in an identical offset level with respect to each other, with a tolerance less than ±1 µm. This is also valid for sensor substrates fabricated through a CMOS or a similar process, and containing integrated circuits.

f. The present invention allows using submicron-thick sealing materials as the disclosed method ensures no step-height in the sealing region.

g. The present invention eliminates the need for an additional patterning step for the metal layer deposited to form the wirebonding pads. This is achieved by utilizing the silicon and oxide layers of the capping substrate as a shadow mask and separative layer, respectively.

h. In one of the embodiments of the present invention, the complete fabrication of a suspended MEMS component encapsulated in a hermetically-sealed cavity requires only three lithography steps.

i. The reduced number of process steps and the elimination of complex processes other than the well-known MEMS deposition/etch/bonding processes increase the reliability and yield as well as lower the cost of manufacturing hermetically-sealed MEMS components with the method of the present invention.

j. The present invention is compatible with CMOS wafers acting as either the sensor or capping substrate, or both.

k. The present invention is compatible with a conductor-refill process inside the via openings, although this is not the only way to get an electrical contact from the vertical feedthroughs for the present invention. Moreover, the conductor-refill process does not need to fill the via openings hermetically for the present invention, as the refill process does not affect the hermeticity of the sealed cavity for the disclosed packaging method.

DEFINITION OF THE FIGURES

In order to explain the present invention in more detail, the following figures have been prepared and attached to the description. The list and the definition of the figures are given below.

FIGS. 1, 2, 3, and 4 describe the four different embodiments of the method presented in this invention, respectively.

FIG. 1A shows a first substrate (2), with a MEMS component (4), metal lead (6), lead support (8), and anchor

(10) of the MEMS component (4), as well as a sealing region (12) and a sealing material (14) that is laid over the sealing region (12);

FIG. 2A shows a first sensor substrate (2), with a MEMS component (4), metal lead (6), lead support (8), and anchor (10) of the MEMS component (4), shield metal (42) as well as a sealing region (12);

FIG. 2B shows a second substrate (16), i.e. the capping substrate, almost identical to the substrate in FIG. 1C, except the fact that it contains an additional sacrificial conductor layer (44);

FIG. 2C shows the sealing region (12) of the sensor substrate (2) anodically bonded to the sealing wall (26) of the capping substrate (16) without using any sealing material and in such a way that the MEMS component (4) is completely encapsulated within the enclosed cavity (30);

DEFINITION OF THE ELEMENTS (FEATURES/COMPONENTS/PARTS) ON THE FIGURES

The definition of the features/components/parts which are covered in the figures that are prepared in order to explain the present invention better are separately numbered and given below.

2—First (sensor) substrate made of a glass base
4—MEMS component
6—Metal leads of the MEMS component
8—Lead supports for the MEMS component
10—Anchor of the MEMS component
12—Sealing region
14—Sealing material laid over the sensor substrate
16—Second (capping) substrate
18—First silicon layer of the second (capping) substrate
20—Buried oxide layer of the second (capping) substrate
22—Second silicon layer of the second (capping) substrate
24—Via opening
26—Sealing wall
28—Vertical feedthroughs
30—Cavity
32—Roof of the cavity
34—Getter material
36—Exposed surface of the vertical feedthrough inside the via opening
38—Wirebonding pad
40—Wirebond
42—Shield metal layer
44—Sacrificial conductor layer
46—Silicon lead
48—Sealing material laid over the capping substrate
50—First (sensor) substrate made of an SOI wafer
52—Buried oxide layer of the first (sensor) substrate
54—Offset gap
56—Base silicon layer of the first (sensor) substrate
58—Isolation layer over the second (capping) substrate
60—Electrical conductor filled within the via opening for lead transfer

DETAILED DESCRIPTION OF THE INVENTION

The present invention aims to provide an easily repeatable, high-yield, high-reliability, and low-cost wafer-level hermetic packaging method applicable to MEMS structures. The invention is described by a few exemplary embodiments, although the scope and spirit of the invention is not limited to the particular forms disclosed by these embodiments.

Figure 1A:
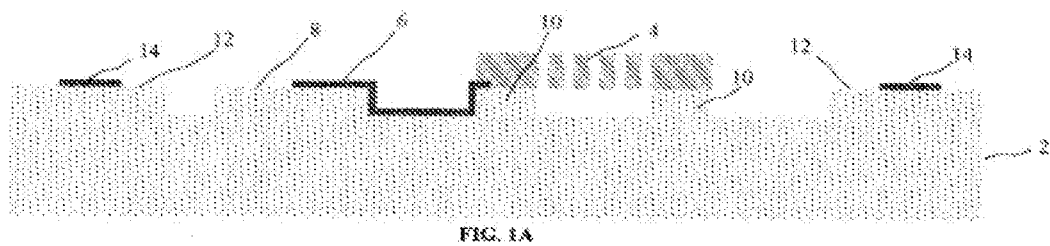
FIG. 1B shows a second substrate (16), which is used to fabricate the capping substrate for the MEMS component (4) in FIG. 1A.
FIG. 1C shows the simultaneous patterning of the sealing wall (26) and vertical feedthroughs (28) simply by etching the first silicon layer (18) of the capping substrate (16) of FIG. 1B until reaching the buried oxide layer (20)
FIG. 1D shows the sealing region (12) of the sensor substrate (2) bonded to the sealing wall (26) of the capping substrate (16) using the sealing material (14) and in such a way that the MEMS component (4) is completely encapsulated in the enclosed cavity (30)

FIG. 1A shows a first substrate (2), with a MEMS component (4), metal lead (6), lead support (8), and anchor (10) of the MEMS component (4), as well as a sealing region (12) and a sealing material (14) that is laid over the sealing region (12). The base of the substrate (2) can be made of a glass such as Borosilicate or Pyrex, simultaneously forming the anchors (10), lead support (8), and the sealing region (12) by etching of the substrate surface using suitable masking layers and etchants known by the ones skilled in the art. Anchors (10) generate an offset in the order of few microns between some parts of the MEMS component (4) and the etched surface of the substrate. This way, the parts of the MEMS component (4) that do not touch to the surface of substrate (2) can be considered as suspended. The metal leads (6) and the sealing material (14) can be formed at the same fabrication step, using the same type of material, and they may have identical thickness. One end of the metal lead (6) is sandwiched between the fixed (not suspended) end of the MEMS component (4) and anchor (10), while the other end of the lead (6) partially climbs on the lead support (8). The lead support (8) and the sealing region (12) lay on the same plane, with an offset tolerance less than ±1 μm with respect to the plane surface. The first substrate (2) is also called the sensor substrate thereafter.

Figure 1B:
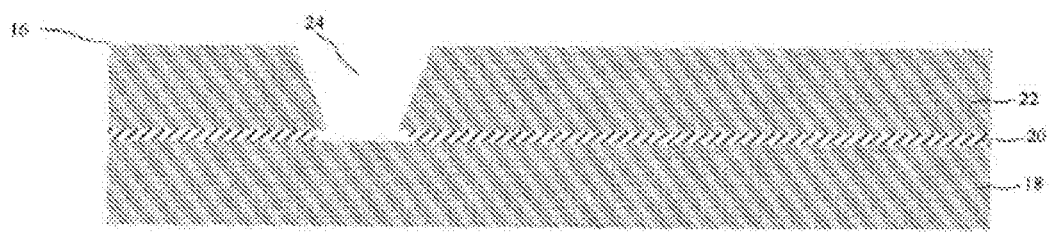

FIG. 1B shows a second substrate (16), which is used to fabricate the capping substrate for the MEMS component (4) in FIG. 1A. The second substrate (16) can be an SOI substrate composed of a conductive first silicon layer (18), a buried oxide layer (20), and a conductive second silicon layer (22). A via opening (24) has been patterned by a masked through-etching of the second silicon layer (22) and then either a blank or masked etch of the buried oxide layer (20) laid inside the via opening (24), reaching to a limited part of the top surface of the first silicon layer (18) through the via opening (24).

Figure 1C:
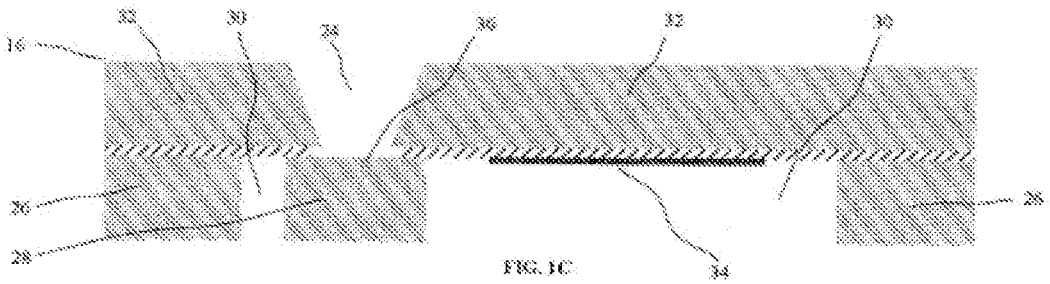

FIG. 1C shows the simultaneous patterning of the sealing wall (26) and vertical feedthroughs (28) simply by etching the first silicon layer (18) of the capping substrate (16) of FIG. 1B until reaching the buried oxide layer (20). Sealing wall (26) completely surrounds both the vertical feedthroughs (28) and a cavity (30), whereas the top of the cavity (30) is also completely closed by the remaining parts of the second silicon layer (22) and the buried oxide layer (24) of the capping substrate of FIG. 1B, forming a roof (32) for the cavity (30). It is possible to coat a getter material (34) over the bottom surface of the roof (32) facing the cavity (30). The getter material (34) can be a thin-film metal layer, which is capable of absorbing unwanted gases inside the cavity (30) after sealing the MEMS component, and can be deposited by using a separately prepared shadow mask.

Figure 1D:
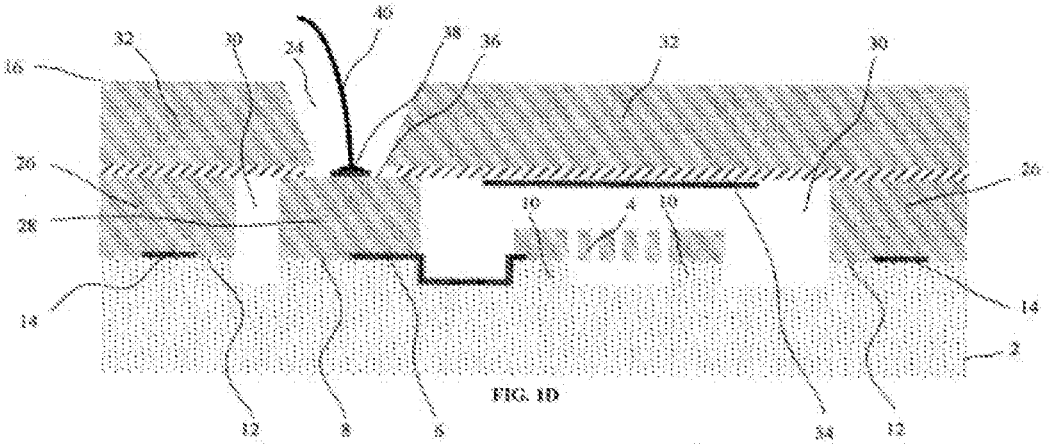

FIG. 1D shows the sealing region (12) of the sensor substrate (2) bonded to the sealing wall (26) of the capping substrate (16) using the sealing material (14) and in such a way that the MEMS component (4) is completely encapsulated in the enclosed cavity (30). Bonding process can be a thermo-compression-based process, which forms an alloy at the bond interface such as Au—Si, Al—Si, etc. Bonding process can be performed in a controlled atmosphere such as a noble gas or vacuum, which defines the desired atmosphere for the MEMS component (4) encapsulated within the enclosed cavity (30). During the bonding process, vertical feedthrough (28) on the capping substrate (16) is also bonded to the lead support (8) on the sensor substrate (2), using the metal lead (6) climbing on the lead support (8) as an intermediate bonding material. Therefore, part of the metal leads (6), which climb on the lead support (8), are sandwiched between the lead support (8) and the vertical feedthrough (28), being electrically short to the vertical feedthrough (28). This way, the metal leads (6) of the MEMS component (4) can be electrically reached from the outer world through the exposed surface (36) of the vertical feedthrough (28), achieving the transfer of the metal leads (6) to the outer world without affecting the hermeticity of the package. Optionally, wirebonding pads (38) can be added on the exposed surface (36) of the vertical feedthrough (28), simply by blank deposition of a suitable metal layer through the via openings (24). Then, wirebonds (40) can be picked from the wirebonding pad (38) using a technique such as ball-wedge style bonding. Alternatively, wirebonds (40) can also be picked directly from the exposed surface (36) of the vertical feedthroughs (28), without using any wirebonding pads (38), with the help of techniques such as wedge-wedge style wirebonding. Getting the electrical contacts from the vertical feedthroughs (28) using wirebonds (40), either with or without using wirebonding pads (38), eliminates the need for a further conductor-refill process inside the via opening (24). It is also possible to form the wirebonding pads (38) by using some deposition/lithography/etch steps performed inside the via opening (24), which may slightly increase the complexity of the process with the benefit of forming smaller-size pads.

In a second embodiment of the present invention, it may be desired to eliminate any sealing materials. It is well-known by the ones skilled in the art that the silicon-glass anodic bonding provides a hermetic seal without the need for an intermediate sealing layer. FIG. 2A shows a first sensor substrate (2), with a MEMS component (4), metal lead (6), lead support (8), and anchor (10) of the MEMS component (4), shield metal (42), as well as a sealing region (12). Here, the sensor substrate (2) does not contain any sealing material over the sealing region (12), contrary to the sensor wafer shown in FIG. 1A. Moreover, the leads (6) in FIG. 2A climbs on the lead support (8) with a shorter overlap compared to the sensor wafer in FIG. 1A, leaving a sufficiently wide bonding area over the lead support (8) for the anodic bonding. In addition, sensor wafer (2) of FIG. 2A contains a shield metal layer (42), which would act as a protective shield layer preventing the suspended parts of the MEMS component (4) to bend down and stick to the substrate surface during the final anodic bonding step.

FIG. 2B shows a second substrate (16), i.e. the capping substrate, almost identical to the substrate in FIG. 1C, except the fact that it contains an additional sacrificial conductor layer (44). This sacrificial conductor layer can be a thin-film metal, and can be patterned using blank deposition followed by a wet etch with a masking layer of spray-coated and patterned photoresist layer. Alternatively, it can be deposited through a separately prepared shadow mask, which eliminates further patterning of the deposited metal. The purpose of the sacrificial conductor layer (44) is to electrically-short all of the electrically-isolated vertical feedthroughs (28) of the capping substrate (16) to the roof (32), in order to eliminate any sparking between the electrically-isolated silicon parts during the final anodic bonding step.

FIG. 2C shows the sealing region (12) of the sensor substrate (2) anodically bonded to the sealing wall (26) of the capping substrate (16) without using any sealing material and in such a way that the MEMS component (4) is completely encapsulated within the enclosed cavity (30). Anodic bonding process can be achieved at a temperature between 250° C. to 400° C. with a bonding voltage in the range 600V up to 1400V, and in a controlled atmosphere as in the first embodiment of the present invention. During the bonding process, vertical feedthrough (28) on the capping substrate (16) is also anodically bonded to the lead support (8) on the sensor substrate (2). Therefore, parts of the metal leads (6), which climb on the lead support (8), are sandwiched between the lead support (8) and the vertical feedthrough (28), being electrically short to the vertical feedthrough (28).

Figure 2D:
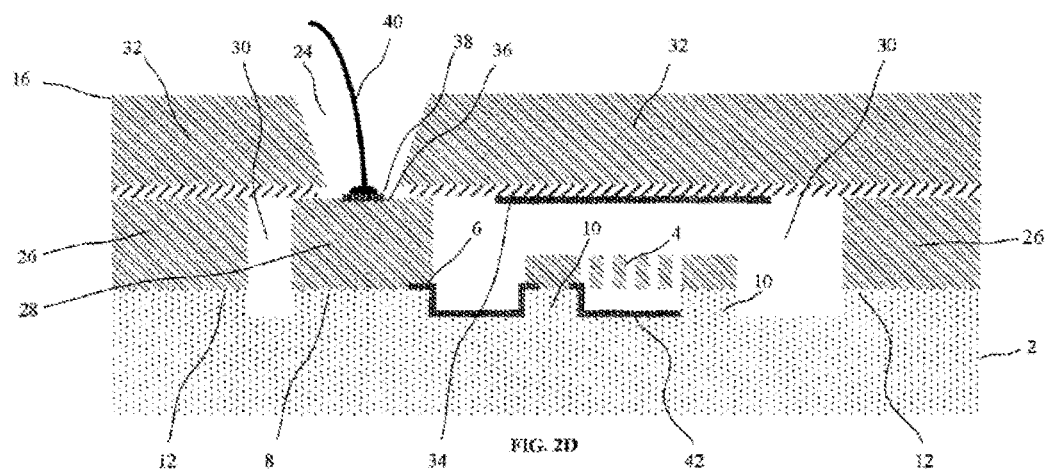
FIG. 2D shows the bonded wafer pair of FIG. 2C after removing the sacrificial conductor layer (44) of FIG. 2C, removing the buried oxide within the via opening (24), and finally forming the wirebonding pads (38) over the exposed surface (36) of the vertical feedthrough (28), to which the wirebond (40) is connected.

FIG. 2D shows the bonded wafer pair of FIG. 2C after removing the sacrificial conductor layer (44) and the buried oxide within the via opening (24), and finally forming the wirebonding pads (38) over the exposed surface (36) of the vertical feedthrough (28), to which the wirebonds (40) can be connected. As in the first embodiment of the present invention, the metal leads (6) of the MEMS component (4) can be electrically reached from the outer world through the exposed surface (36) of the vertical feedthrough (28), achieving, the transfer of the metal leads (6) to the outer world without affecting the hermeticity of the package. Again as in the first embodiment of the present invention, it is possible to get electrical contacts from the vertical feedthroughs (28) using wirebonds (40), either with or without using wirebonding pads (38), eliminating the need for a further conductor-refill process inside the via opening (24).

Figure 3A:
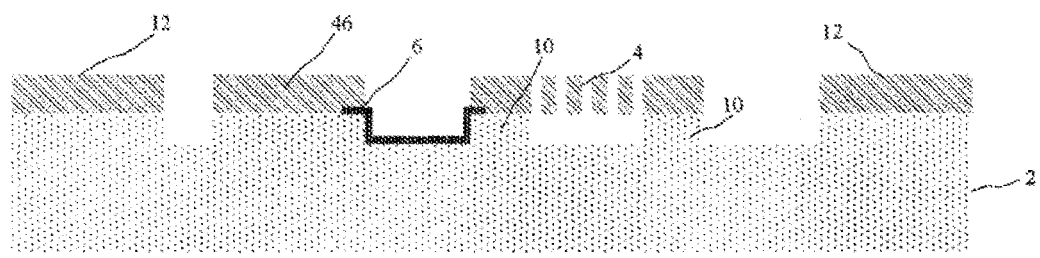
FIG. 3A shows a first sensor substrate (2), with a MEMS component (4), metal lead (6), silicon lead (46), and anchor (10) of the MEMS component (4), as well as a sealing region (12)

In a third embodiment of the present invention it may be desired to select the thickness and material of the sealing layer independently from the thickness and material of the lead metallization of the MEMS component, provided that the sealing material is an electrical conductor. FIG. 3A shows a first sensor substrate (2), with a MEMS component (4), metal lead (6), silicon lead (46), and anchor (10) of the MEMS component (4), as well as a sealing region (12). Here, the sealing region (12) is made of silicon instead of the glass sealing regions of the first two embodiments. Moreover, there exist silicon leads (46) in FIG. 3A, in addition to the metal leads (6), which are electrically-shorted to each other. Metal leads (6) are used to electrically-connect the MEMS component (4) to the silicon leads (46), while the metal leads (6) would not have a direct physical contact with the vertical feedthroughs on the capping substrate.

Figure 3B:
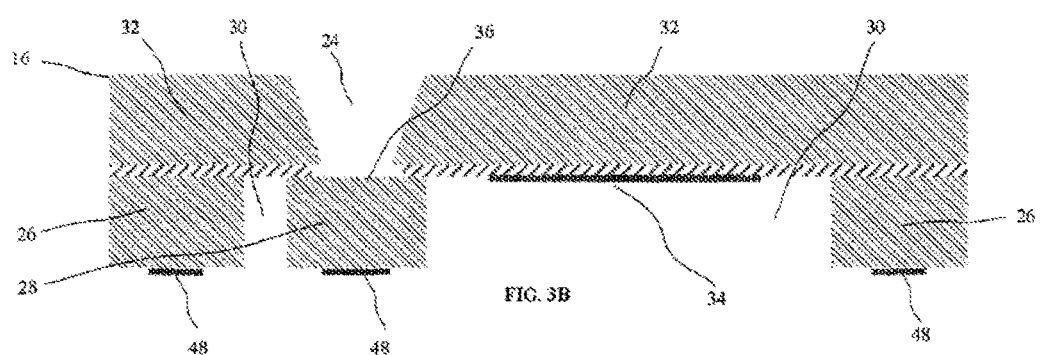
FIG. 3B shows a second substrate (16), i.e. the capping substrate, almost identical to the capping substrate in FIG. 1C, except the fact that it contains an additional sealing material (48), which is deposited over the bottom surfaces of both the sealing wall (26) and vertical feedthroughs (28)

FIG. 3B shows a second substrate (16), i.e. the capping substrate, almost identical to the capping substrate in FIG. 1C, except the fact that it contains an additional sealing material (48), which is deposited over the bottom surfaces of both the sealing wall (26) and vertical feedthroughs (28). It is also possible to deposit a sealing material over the top surfaces of the sealing region (12) and silicon leads (46) of the sensor substrate (2) in FIG. 3A, although not shown in this embodiment. Aforementioned sealing materials on the sensor substrate (2) and the capping substrate (16) can be identical or different in terms of material type or thickness, depending on the bonding process to be used (Au—Sn, Au—In, Sn—Au—Sn, Al—Ge, etc.).

Figure 3C:
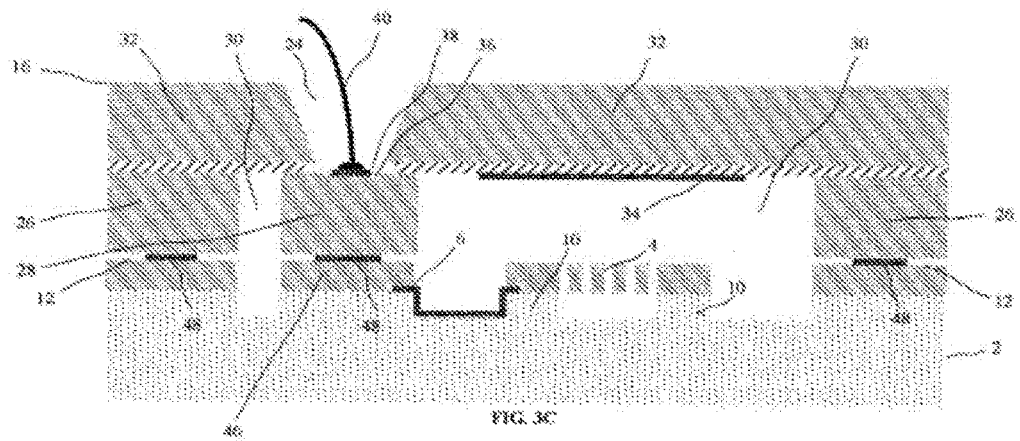
FIG. 3C shows the sensor substrate (2) and capping substrate (16) bonded to each other using the sealing material(s) (48) and in such a way that the MEMS component (4) is completely encapsulated in the enclosed cavity (30)

FIG. 3C shows the sensor substrate (2) and capping substrate (16) bonded to each other using the sealing material(s) (48) and in such a way that the MEMS component (4) is completely encapsulated in the enclosed cavity (30). Lead transfer is achieved in a similar manner as in the first two embodiments of the present invention, using the vertical feedthroughs (28) and wirebonds (40). In this embodiment, it is possible to select the material and thickness of the sealing material (48) independently from the metal leads (6), as a useful extension of the first embodiment in which the sealing material and the metal leads are formed by identical metal layer and have identical thickness.

Figure 4A:
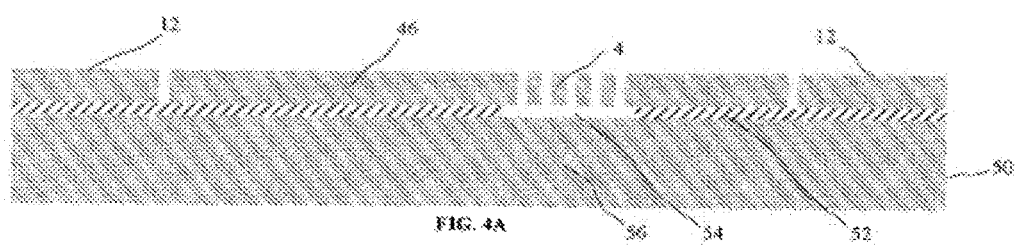
FIG. 4A shows a first substrate (50) with a MEMS component (4), silicon lead (46) of the MEMS component (4), as well as a sealing region (12)

In a fourth embodiment of the present invention, it is possible to fabricate a suspended MEMS component encapsulated in a hermetically-sealed cavity with only three lithography steps. FIG. 4A shows a first substrate (50) with a MEMS component (4), silicon lead (46) of the MEMS component (4), as well as a sealing region (12). Different from the first three embodiments is that here the sensor substrate (50) is an SOI substrate, and contains no metal layers on it. It would be accepted by the ones skilled in the art that a single lithography step is sufficient to fabricate such a sensor substrate, which would be used for defining the features of the MEMS component (4). The release of the MEMS component (4) can be achieved by using the MEMS component (4) itself as a self-aligned mask over the buried oxide layer (52) of the sensor substrate (50), and performing a timed etch of buried oxide layer (52) that is sufficient to form an offset gap (54) between the MEMS component (4) and the base silicon layer (56) of the sensor substrate (50).

Figure 4B:
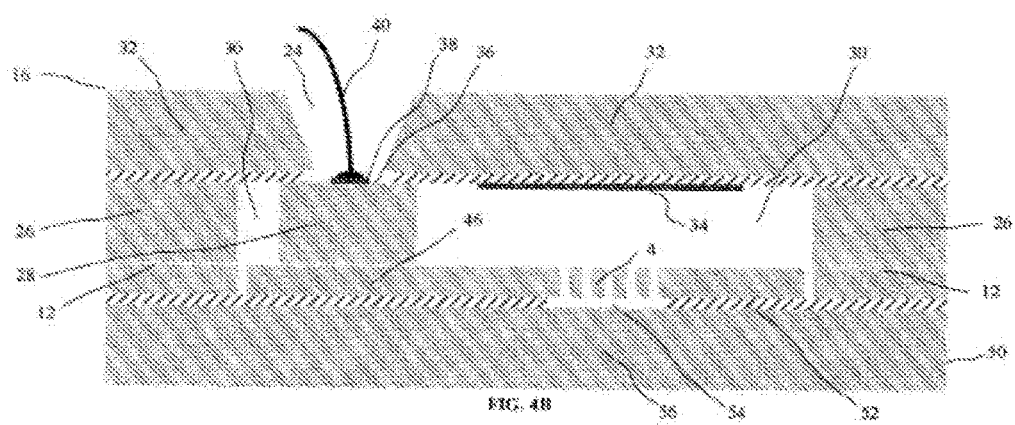
FIG. 4B shows a second substrate (16), which is identical to the capping substrate of FIG. 1C, and bonded to the sealing region (12) and silicon leads (46) of the sensor substrate (50) through the sealing wall (26) and vertical feedthroughs (28)

FIG. 4B shows a capping substrate (16), which is identical to the capping substrate of FIG. 1C, bonded to the sealing region (12) and silicon leads (46) of the sensor substrate (50) through the sealing wall (26) and vertical feedthroughs (28). The bonding process used here is the silicon-fusion bonding, preferably with a plasma activation step prior to the bonding in order to reduce the bonding temperature down to about 200° C. Once the sensor substrate (50) and capping substrate (16) are bonded to each other, the lead transfer and wirebonding can be achieved as in the first three embodiments of the present invention. Only two lithography masks are sufficient to fabricate the capping wafer (16) in FIG. 4B (and also in FIG. 1C), making it possible to fabricate the "hermetically-sealed" MEMS component (4) in FIG. 4B by using only three lithography masks. It is possible to use additional sealing materials on the sensor substrate (50) and capping substrate (16) of this embodiment and using different wafer bonding methods, at the cost of increasing the number of required fabrication masks.

Figure 5:
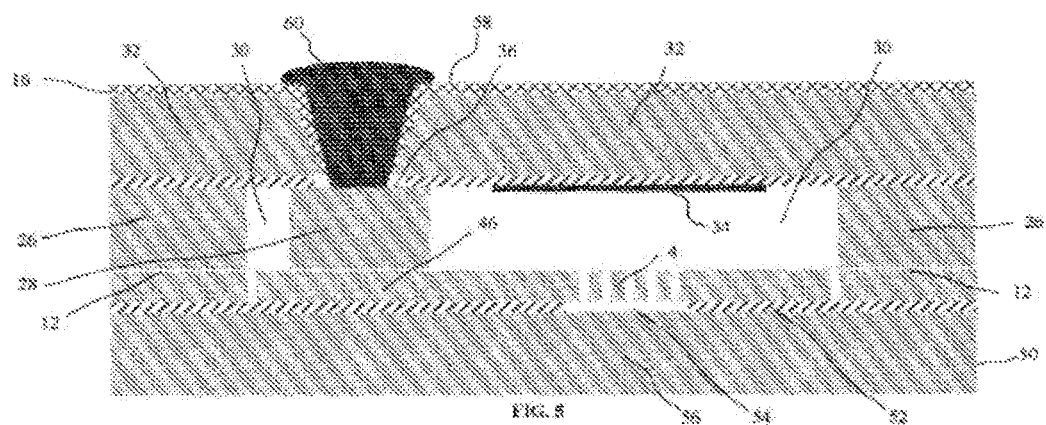
FIG. 5 shows the via-refill technique applied to the packaging method of the present invention, as an alternative to the wirebonding technique that is used to get electrical contact from the vertical feedthroughs (28)

In all of the four embodiments disclosed above, wirebonding method is highlighted for getting the electrical contacts from the vertical feedthroughs (28), either with or without using wirebonding pads (38). This eliminates the need for a conductor-refill process inside the via opening (24). On the other hand, there exist alternative methods for getting electrical contacts from the vertical feedthroughs (28), such as the via-refill process. FIG. 5 shows the bonded substrates of FIG. 4B, for which an isolation layer (58) has been deposited over the capping substrate (16) that covers the exposed surfaces of the capping substrate (16). Moreover, the via opening (24) of FIG. 4B has been refilled with an electrical conductor (60) in order to get electrical contact from the vertical feedthrough (28). Although the packaging method described in the present invention eliminates the need for via-refill technique by utilizing wirebonding technique instead, it is still compatible with the via-refill processes, which can be desirable over wirebonding for certain applications such as flip-chip attachment of the capped sensors to an IC chip. The via-refill technique demonstrated in FIG. 5 is compatible with all the embodiments disclosed above. Another advantage of the via-refill technique shown in FIG. 5 is that it does not need to fill the via opening (24) hermetically, since the hermeticity of the cavity (30) has not been affected neither by the isolation layer (58) nor by the electrical conductor (60) refilled inside the via opening (24).

In the embodiments of the present invention listed above, the reduced number of process steps and the elimination of complex processes other than the well-known MEMS deposition/etch/bonding processes increase the reliability and yield as well as lower the cost of manufacturing the hermetically-sealed MEMS components.

The present invention and the embodiments have been described for the clarity of understanding. These descriptions provided in the above embodiments should not be considered to restrict or limit the scope of the appended claims of the present invention. It is always possible for the skilled in the art to find different modifications and alternatives within the scope and spirit of the following claims.

The invention claimed is:

1. A method for wafer-level hermetic packaging of MEMS components comprising:
   providing a first substrate having a MEMS component, conductive leads of the MEMS component, anchors that keep some part of the MEMS component at a predefined offset from a surface of the first substrate, and a sealing region that completely surrounds the MEMS component and the conductive leads;
   providing a second substrate comprising a first silicon layer, a second silicon layer, and a buried oxide layer sandwiched between the first silicon layer and second silicon layer, the second substrate having a number of vertical feedthroughs formed using the first silicon layer and a sealing wall formed using the first silicon layer, the sealing wall completely surrounding the vertical feedthroughs, a roof formed using the second silicon layer and buried oxide layer and completely covering the region surrounded by the sealing wall from the top, a number of via openings formed using the second silicon layer and buried oxide layer and reaching to the top surfaces of the vertical feedthroughs through the roof, and a cavity surrounded by the sealing wall and the roof;

bonding the sealing region of the first substrate to the sealing wall of the second substrate in such a way that the MEMS component on the first substrate is encapsulated in a closed volume defined by the first substrate and the cavity of the second substrate, and simultaneously, bonding the conductive leads on the first substrate to the corresponding vertical feedthroughs on the second substrate;

forming wire bonding pads on the exposed surfaces of the vertical feedthroughs that are exposed to the via openings on the second substrate;

providing an isolation layer has been deposited over the second substrate that covers the exposed surfaces of the second substrate and the via opening has been refilled with an electrical conductor in order to get electrical contract from the vertical feedthrough.

2. The method of claim 1 wherein the second substrate is an SOI substrate.

3. The method of claim 1 wherein the second substrate contains a getter material coated at the bottom surface of the roof facing the cavity.

4. The method of claim 1 wherein either the first substrate or the second substrate or both contain integrated circuits fabricated through a CMOS or similar IC fabrication process.

5. The method of claim 1 wherein the sealing region is made of glass.

6. The method of claim 5 wherein bonding comprises eutectic or transient liquid phase bonding.

7. The method of claim 5 wherein either the sealing region, or the sealing wall or both contain a sealing material on them.

8. The method of claim 5 wherein bonding comprises silicon-glass anodic bonding.

9. The method of claim 1 wherein the sealing region is made of silicon.

10. The method of claim 9 wherein either the sealing region, or the sealing wall or both contain a sealing material on them.

11. The method of claim 9 wherein boding comprises eutectic or transient liquid phase bonding.

12. The method of claim 9 wherein neither the sealing region, or the sealing wall contains a sealing material on them.

13. The method of claim 9 wherein bonding comprises silicon fusion bonding.

14. The method of claim 1 wherein an electrical conductor filled within the via openings on the second substrate to get electrical contact from the exposed surfaces of the vertical feedthroughs.

* * * * *